United States Patent [19]

Jamet et al.

[11] Patent Number: 5,266,053
[45] Date of Patent: Nov. 30, 1993

[54] SEAL, IN PARTICULAR ELECTROMAGNETIC SEAL

[75] Inventors: Daniel Jamet, Nozay; Rémi Verdurand, Neuilly, both of France

[73] Assignee: Alcatel Cit, Paris, France

[21] Appl. No.: 929,130

[22] Filed: Aug. 13, 1992

[30] Foreign Application Priority Data

Aug. 14, 1991 [FR] France .................. 91 10339

[51] Int. Cl.$^5$ .................................. H01R 13/648
[52] U.S. Cl. .................................... 439/607; 439/108
[58] Field of Search ............ 439/92, 101, 108, 607, 439/609, 610

[56] References Cited

U.S. PATENT DOCUMENTS

| | | |
|---|---|---|
| 4,006,872 | 2/1977 | Tanner . |
| 4,583,808 | 4/1986 | Porter et al. . |
| 4,708,412 | 11/1987 | Himes, Jr. et al. . |
| 4,906,201 | 3/1990 | Young et al. ............ 439/108 |
| 5,112,251 | 5/1992 | Cesar ........................ 439/108 X |

FOREIGN PATENT DOCUMENTS

| | | |
|---|---|---|
| 0073112 | 3/1983 | European Pat. Off. . |
| 2613907 | 10/1977 | Fed. Rep. of Germany . |
| 0183979 | 7/1990 | Japan .................. 439/609 |

Primary Examiner—Larry I. Schwartz
Assistant Examiner—Khiem Nguyen
Attorney, Agent, or Firm—Sughrue, Mion, Zinn, Macpeak & Seas

[57] ABSTRACT

An electromagnetic seal consists essentially of an oblong metal plate with two bends along two parallel longitudinal bending axes (D1, D2) defining on the plate two lateral flanges (34, 35) inclined relative to a central panel (36), and an central oblong opening (29) which has a width (a) slightly less than the distance (b) between the bending axes so that parts of the central panel situated on the longitudinal edges of the central oblong opening, separated before bending by cut-outs on the transverse edges of the opening and between the bending axes and the central oblong opening, are adapted to form oblique extensions of said lateral flanges in the region of the central oblong opening.

1 Claim, 4 Drawing Sheets

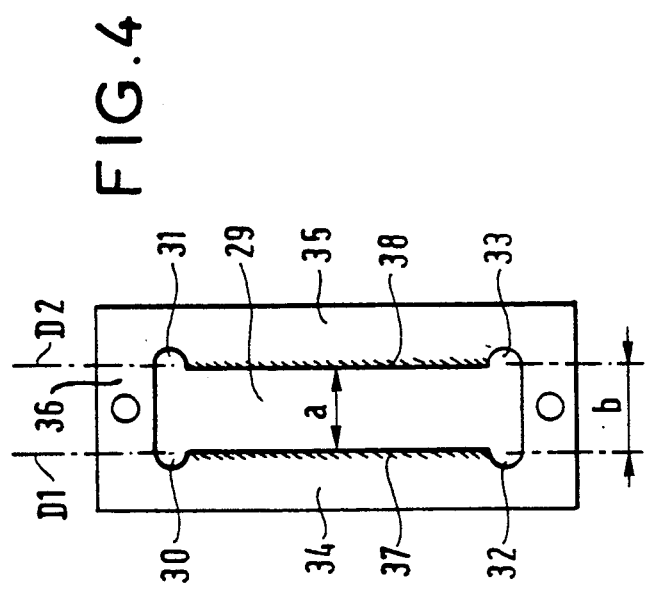
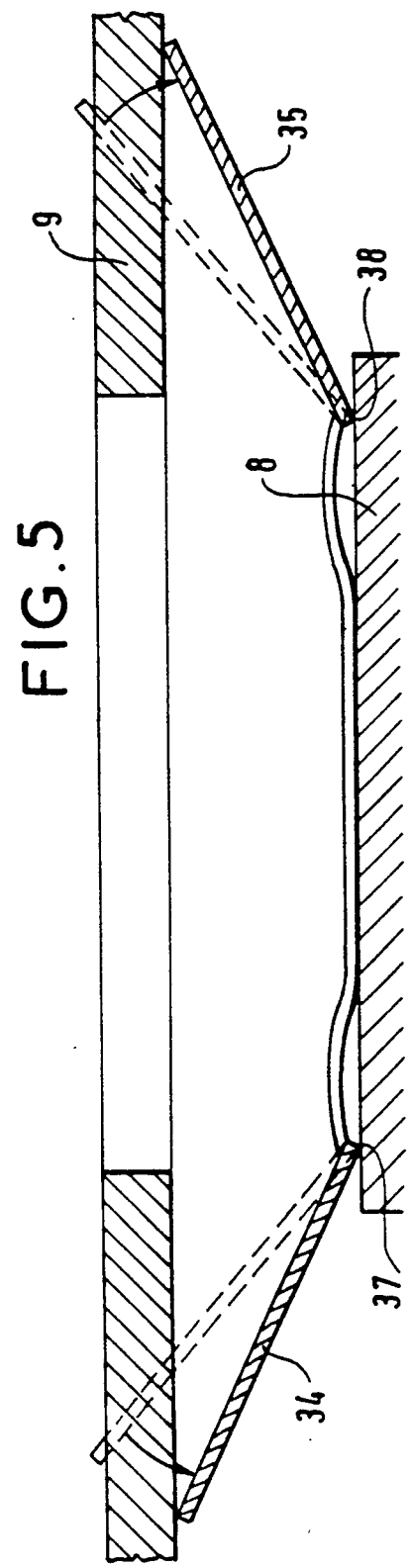

SEAL, IN PARTICULAR ELECTROMAGNETIC SEAL

The present invention concerns a seal, in particular for attaching the protective metal housing of an electric connector to a shield protecting against electromagnetic interference.

To protect electronic equipment such as telecommunication equipment, for example, against electromagnetic interference it is known to provide the equipment racks or subracks with protective metal shields, to provide the connections internal or external to the racks or subracks with protective metal shielding and to provide the connectors of these various links with protective metal housings so that the shielding of the links connected by the connectors are connected to the ground of these housings.

Especially in the case of electric connectors used to connect links external to a rack or subrack to links internal to the rack or subrack, the housings usually have a shape adapted to establish electrical continuity between the housing and the protective shield of the rack or subrack where openings are formed in the shield for the connectors fitted with their housings to pass through.

More particular reference will be made hereinafter, by way of example, to a multicontact connector such as that shown in perspective in FIG. 1 which has a first series of contacts 2 embedded in a molded plastics material envelope 11 and which, in the application to an electronic equipment rack or subrack mentioned above and shown in FIG. 2, are placed in corresponding holes of a printed circuit board 3 which is inside a subrack in this example and is referred to as the backplane and a second series of contacts 5 in corresponding relationship to the first series and visible only in FIG. 2, given the different orientation of the connector in the two figures, the second series of contacts being adapted to connect to a complementary shielded connector 6 connected to a cable 7 external to the subrack.

A protective metal housing 1 mates with the plastics material envelope 11 over most of its exterior, leaving an uncovered part near the surface from which the contacts 2 project. This arrangement enables full insertion of said contacts into the holes provided in the printed circuit board without causing short-circuits between nearby tracks of said circuit. The metal housing 1 has on its exterior, substantially in its central part in the depthwise direction of these figures, a plane shoulder 8 adapted to provide a surface bearing against a metal plate formed by a portion 9 of the protective shield 9' set back parallel to the backplane 3 at a sufficient distance from the latter to enable insertion of such connectors provided with protective metal housings, one only of which is shown in FIG. 2, once fitted.

The multicontact connector and its protective metal housing have an oblong shape and in this example, as shown in FIG. 1, the plane shoulder has a relatively small height on the longitudinal sides of the housing and a relatively large width on the transverse sides of the housing, where it is provided with means for fixing it to the backplane 3, these means in this example comprising two screwthreaded spacers 4, 4' adapted to cooperate with screws that are not shown in this figure.

To improve the quality of the electrical connection between the plate 9 and the shoulder 8 when these two members have been assembled together in this way, with a view to improving the protection of the equipment in question against electromagnetic interference, it is known to use an intermediate part referred to as an electromagnetic seal.

It is known to implement a seal of this kind by means of an oblong metal sheet provided with an oblong opening adapted to receive said housing and retaining it by said shoulder, said plate having on the longitudinal edges of this opening, as seen in longitudinal cross-section, undulations intended to provide said electric connection between the plate and the shoulder.

It is also known to implement a seal of this kind by means of an oblong metal plate having an oblong opening adapted to receive said housing and to retain it by said shoulder, said plate being further cut out at the edge of the opening to form a set of blade members adapted to provide said electrical connection between the plate and the shoulder.

Although they are resilient, seals of this kind cannot provide an electrical connection of sufficient quality between the plate and the shoulder especially if, in the absence of any seal, there would be a relatively large gap between the plate and the shoulder after the connector was mounted on the backplane and then the plate fixed to the backplane. A gap might result, for example, from the use of more than one type of connector, having different dimensions, intended to be mounted on the same plate, or from a lack of flatness of the plate because of the relatively large surface area, the plate being fixed to the backplane or possibly to uprights of the subrack to which the backplane is also fixed by only a simple fixing, for example, at a few points around the edge of the plate.

An object of the present invention is to provide a resilient seal which can be used for connectors with oblong protective metal housings, such as multicontact connectors of the type shown in FIGS. 1 and 2, and in this case to achieve an improved quality of electrical connection between the plate and the housings of connectors than that achieved with prior art seals.

The present invention consists in a seal for attaching a first member such as an oblong electrical connector housing providing protection against electromagnetic interference having a first bearing surface at its edge to a second member such as an electromagnetic interference protection shield including an opening adapted to receive said first member and retain it by virtue of engagement with said first bearing surface, the edge of said opening itself forming a second bearing surface, which seal comprises an oblong metal plate folded along two longitudinal folding axes defining on said plate two lateral flanges inclined relative to a central panel with an inclination enabling the edges of said lateral flanges to bear against said second bearing surface on application of a force to the plate tending to return said plate to its shape before bending, said oblong metal plate further comprising a central oblong opening adapted to receive said first member and said central oblong having a width slightly less than the distance between said folding axes so that parts of the central panel situated on the transverse edges of the opening in the oblong metal plate which before bending are separated by cut-outs situated on the longitudinal edges of the oblong opening and between the bending axes and the oblong opening are adapted to form an extension of said lateral flanges in the region of the central oblong opening in the oblong metal plate with the same inclination as the lateral flanges and adapted to bear against said first bearing surface of the oblong connector housing on application of said force.

Other objects and features of the present invention will emerge from the following description of embodiments thereof given with reference to the appended drawings.

BRIEF DESCRIPTION OF THE DRAWINGS

FIG. 4 is a front view (with reference to the perspective view in FIG. 3) of the seal in accordance with the invention.

FIG. 5 is a view in cross-section on the line X—X' in FIG. 3 simplified merely to emphasize the points of contact of the electrical connection between the plate and the housing by means of the seal in accordance with the invention during assembly.

DESCRIPTION OF THE PREFERRED EMBODIMENT

Figure 1:
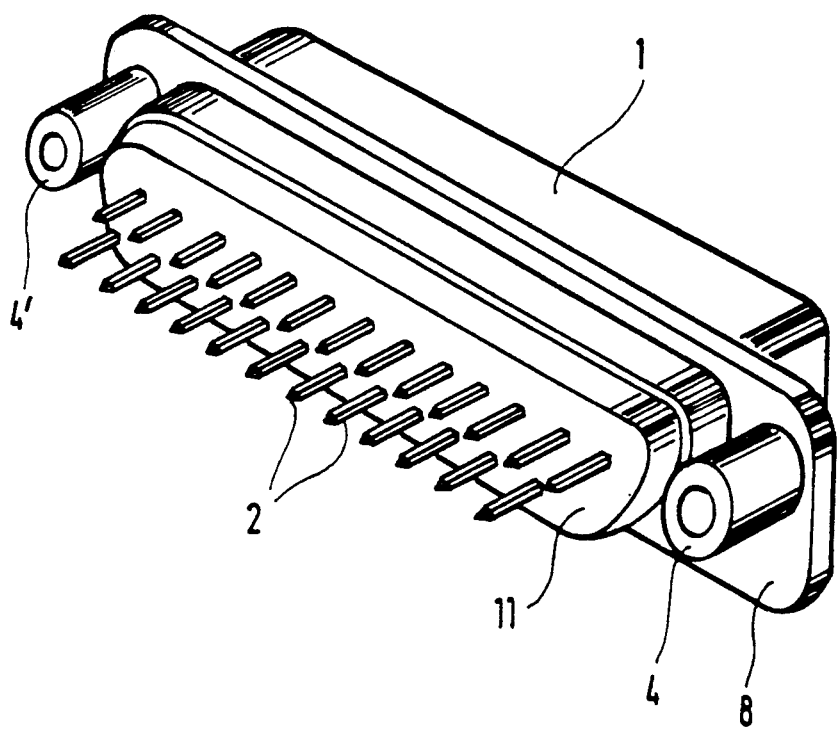
FIGS. 1 and 2, already described, respectively show a perspective view of one example of oblong connector to which the seal in accordance with the invention applies and a partially cut away perspective view showing use of a connector of this kind in an electronic equipment subrack.
Figure 2:
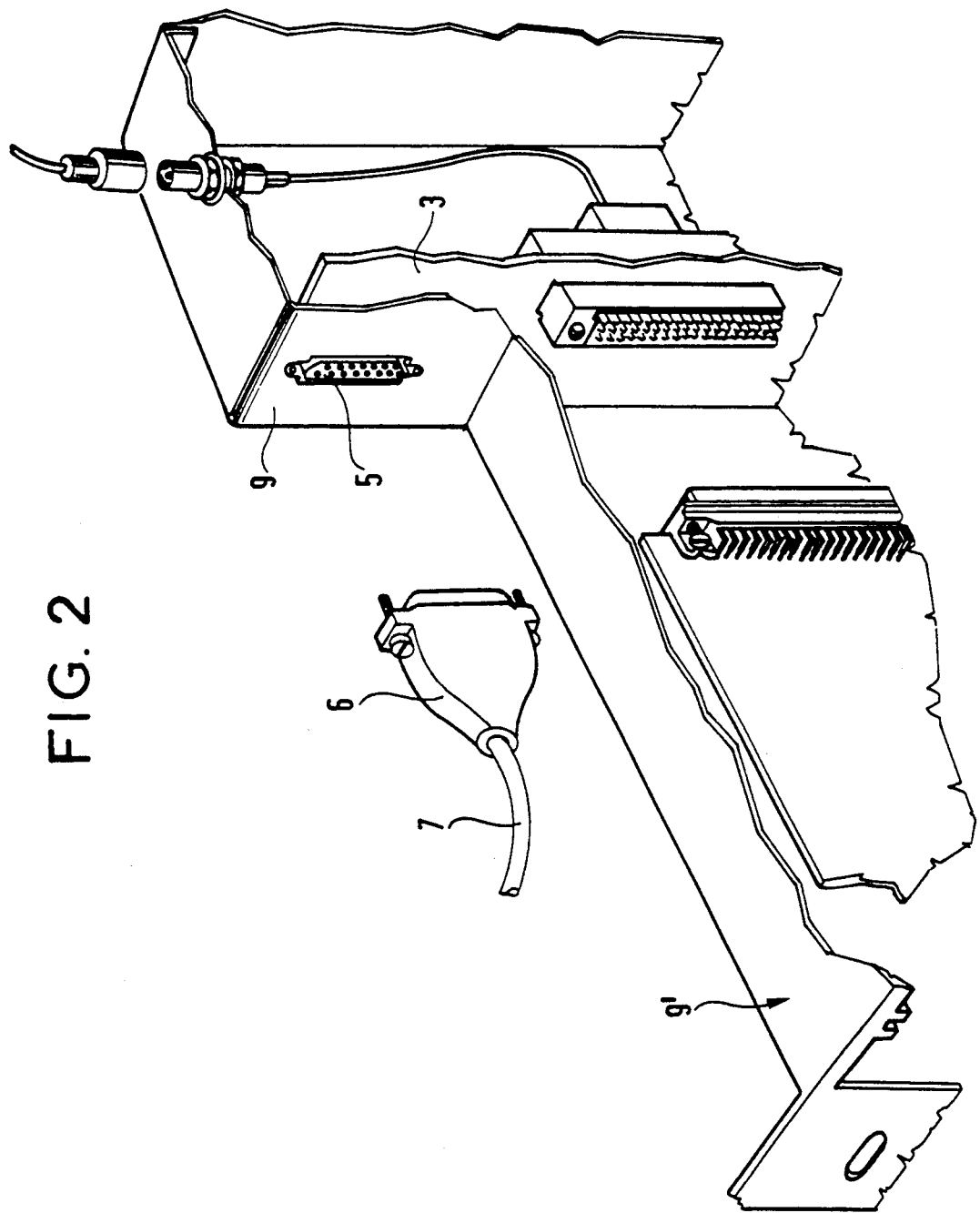
Figure 3:
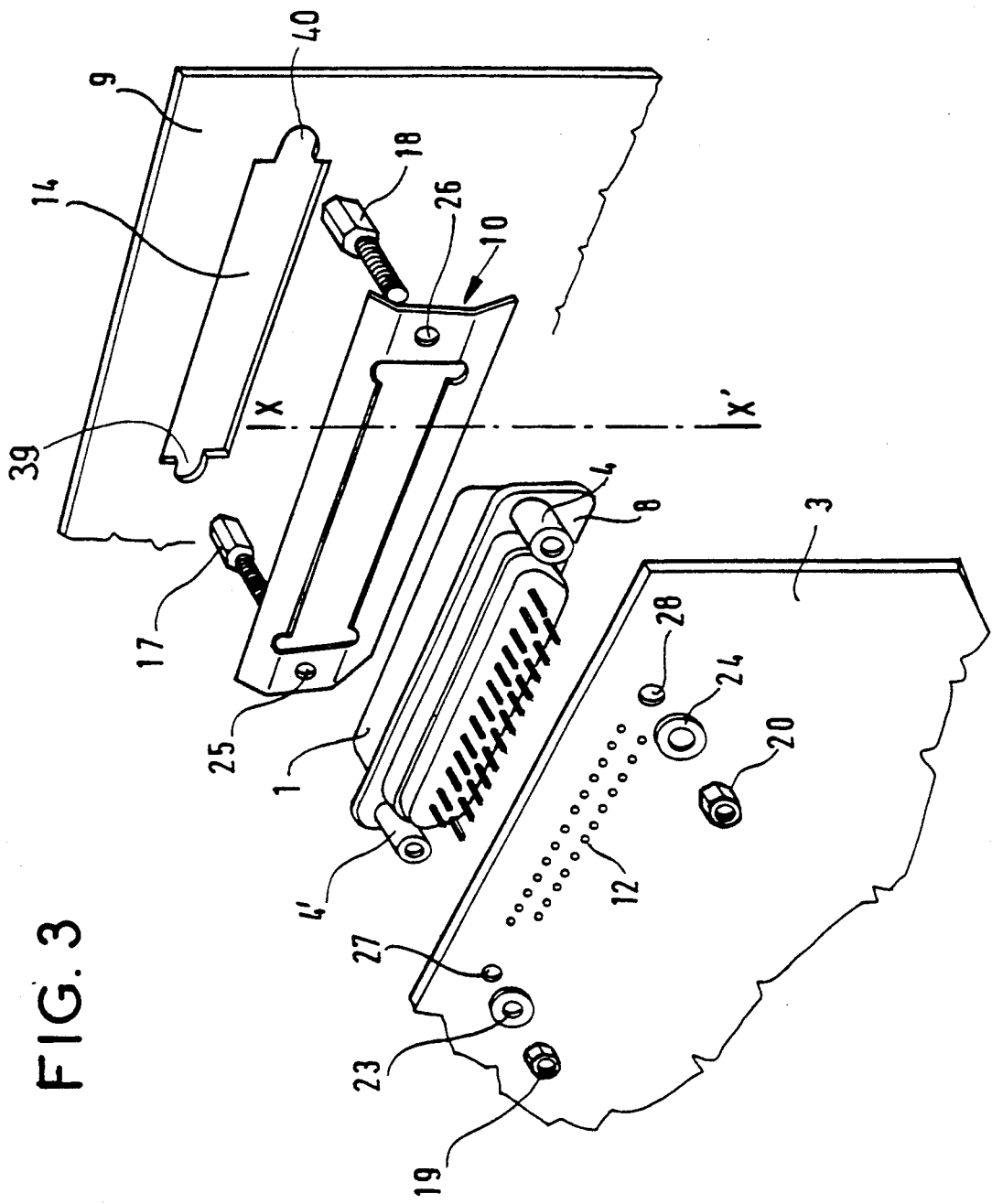
FIG. 3 is an exploded perspective view showing one method of assembling a connector provided with a protective metal housing like that shown in FIG. 1 using an electromagnetic seal in accordance with the invention.

FIG. 3 shows in an unassembled state and in the reverse order as compared with FIG. 2 the backplane 3, the connector and in particular its housing 1 and the plate 9, rotated through 90° in the plane of the paper as compared with their position shown in FIG. 2.

FIG. 3 therefore shows the holes 12 formed in the backplane and adapted to receive the contacts or pins 2 of the connector.

An opening 14 in the plate 9 is adapted to receive the housing 1 of the connector and retain it by its shoulder 8.

In the example shown in FIG. 3 the shoulder 8 of the housing 1 is first fixed to the backplane 3 by means of screws 17, 18 appropriate to the screwthreaded spacers 4, 4' and by washers 23 and 24 and nuts 19, 20, the backplane 3 comprising holes 27, 28 for the screws 17, 18 to pass through.

The seal 10 in accordance with the invention is fitted between the shoulder and the plate and also incorporates holes 25, 26 for the screws 17, 18 to pass through.

When the backplane-housing-seal have been assembled in this way the plate 9 is simply laid against the seal 10 before it is itself fixed to the backplane 3, for example, by fixing means that are not shown here and in an operation which may then constitute a single operation for assembling a plurality of connectors in this way between the same plate and the same backplane 3.

The opening 14 in the plate 9 is extended by slots 39, 40 providing access to the screws 17, 18 when the plate 9 has been fitted.

The seal in accordance with the invention has a resilient structure to improve the quality of the electric connection between the plate and the shoulder of the connector housing, not only at the points of contact between the seal and the plate but also at the points of contact between the seal and the shoulder, even if there would be a relatively large gap between the shoulder and the plate in the absence of the seal after the connector were mounted on the backplane and the plate fixed to the backplane.

Referring to FIG. 4, the seal is made from an oblong metal plate in which a substantially central oblong opening 29 is formed adapted to receive the housing of the connector together with cut-outs 30, 31, 32, 33 providing discontinuities between the transverse and longitudinal edges of this central oblong opening 29 and which is then bent at the location of these cut-outs along two longitudinal bending axes D1 and D2 the distance "b" between which is slightly greater than the width "a" of the opening so as to define two lateral flanges 34 and 35 inclined relative to a central panel 36 and extending in the area of the opening into parts 37 and 38 (shown shaded for easier understanding) between the bending axes and the opening and with the same inclination as the lateral flanges.

When the plate and the shoulder are pressed together through this seal by a force exerted on the assembly, in this example when the plate is fixed to the back plane, for example, tending to return said oblong metal plate to its shape before bending, as shown in FIG. 5, the respective outer edges of the lateral flanges 34 and 35 bear and slide against the plate 9 and the parts 37 and 38 bear and slide against the shoulder 8 so that very good contact is obtained between the seal and the plate 9 and between the seal and the shoulder 8, at least over the longitudinal edges of the central oblong opening 29. This procures a very good electrical connection between the connector housing and the subrack protective plate.

We claim:

1. Seal for attaching a first member such as an oblong electrical connector housing providing protection against electromagnetic interference having a first bearing surface at an edge thereof to a second member such as an electromagnetic interference protection shield including an opening adapted to receive said first member and retain it by virtue of engagement with said first bearing surface, the periphery of said second member about said opening forming a second bearing surface, said seal comprising an oblong metal plate folded along two longitudinal folding axes thus defining on said oblong plate two lateral flanges and a central panel, said lateral flanges being inclined relative to a central panel with an inclination enabling opposed outer edges of said lateral flanges to bear against said second bearing surface on application of a force to the oblong metal plate tending to return said oblong metal plate to its shape before bending, said metal plate further comprising a central oblong opening having transverse edges being sized and adapted to receive said first member and said central oblong opening having a width slightly less than the distance between said folding axes so that parts of the central panel situated between the transverse edges of the central oblong opening the oblong metal plate and separated by cutouts, form extensions of said lateral flanges in the region of the central oblong opening in the oblong metal plate with the same inclination as the lateral flanges and bear against said first bearing surface on application of said force.

* * * * *